US010497844B2

(12) United States Patent
Yamashita

(10) Patent No.: US 10,497,844 B2
(45) Date of Patent: Dec. 3, 2019

(54) LIGHT-EMITTING DEVICE

(71) Applicant: NICHIA CORPORATION, Anan-shi, Tokushima (JP)

(72) Inventor: Toshiaki Yamashita, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/230,800

(22) Filed: Dec. 21, 2018

(65) Prior Publication Data
US 2019/0148609 A1   May 16, 2019

Related U.S. Application Data

(63) Continuation of application No. 15/608,661, filed on May 30, 2017, now Pat. No. 10,211,381.

(30) Foreign Application Priority Data

May 31, 2016   (JP) .................... 2016-109252

(51) Int. Cl.
*H01L 33/60* (2010.01)
*F21K 9/64* (2016.01)
(Continued)

(52) U.S. Cl.
CPC ............. *H01L 33/60* (2013.01); *F21K 9/64* (2016.08); *H01L 33/44* (2013.01); *H01L 33/507* (2013.01);
(Continued)

(58) Field of Classification Search
CPC ......... H01L 33/60; H01L 33/44; H01L 33/54; H01L 33/405; H01L 33/50; H01L 33/507; F01K 9/64; H01S 5/022; F21K 9/64
See application file for complete search history.

(56) References Cited

U.S. PATENT DOCUMENTS 9,316,372 B2   4/2016   Harada
9,516,770 B2   12/2016   Kanchiku
(Continued)

FOREIGN PATENT DOCUMENTS

EP   2 779 331 A1   9/2014
JP   H11-087778 A   3/1999
(Continued)

OTHER PUBLICATIONS

Non-Final Office Action on U.S. Appl. No. 15/608,661 dated Jun. 4, 2018.

*Primary Examiner* — Mariceli Santiago
(74) *Attorney, Agent, or Firm* — Foley & Lardner LLP

(57) ABSTRACT

A light-emitting device includes: a semiconductor laser element; a supporting member located above the semiconductor laser element, the supporting member having a through-hole that allows light emitted from the semiconductor laser element to pass therethrough; a fluorescent member located in the through-hole, the fluorescent member containing a fluorescent material that is excitable by light emitted from the semiconductor laser element so as to emit light having a wavelength different from a wavelength of the light emitted from the semiconductor laser element; and a light-transmissive heat dissipating member including: a base portion, and a projecting portion projecting from the base portion into the through-hole. An upper surface of the projecting portion of the heat dissipating member is bonded to a lower surface of the fluorescent member. An upper surface of the base portion of the heat dissipating member is bonded to a lower surface of the supporting member.

13 Claims, 3 Drawing Sheets

(51) Int. Cl.
*H01L 33/64* (2010.01)
*H01L 33/50* (2010.01)
*H01L 33/44* (2010.01)
*H01S 5/022* (2006.01)
*F21S 41/16* (2018.01)
*H01L 33/40* (2010.01)
*H01L 33/54* (2010.01)
*H01S 5/00* (2006.01)
*H01S 5/024* (2006.01)

(52) U.S. Cl.
CPC ........ *H01L 33/644* (2013.01); *H01S 5/02296* (2013.01); *F21S 41/16* (2018.01); *H01L 33/405* (2013.01); *H01L 33/50* (2013.01); *H01L 33/54* (2013.01); *H01S 5/005* (2013.01); *H01S 5/02212* (2013.01); *H01S 5/02469* (2013.01)

(56) References Cited

U.S. PATENT DOCUMENTS

| | | |
|---|---|---|
| 2014/0085923 A1 | 3/2014 | Nakazato |
| 2014/0160782 A1 | 6/2014 | Harada |
| 2014/0268787 A1* | 9/2014 | Nozaki ............... H01S 3/005 362/259 |
| 2015/0009703 A1* | 1/2015 | Morizumi ........... G02B 6/0008 362/553 |
| 2015/0077972 A1* | 3/2015 | Sugiyama ............. F21V 9/30 362/84 |
| 2015/0303648 A1* | 10/2015 | Kozuru ............... H01S 5/005 362/235 |
| 2016/0084451 A1* | 3/2016 | Annen ............... G02B 6/0006 362/553 |
| 2016/0091171 A1* | 3/2016 | Okada ............... F21V 3/061 372/44.01 |
| 2016/0369954 A1* | 12/2016 | Anc .................. H01L 33/502 |
| 2017/0063032 A1* | 3/2017 | Morizumi ........... H01S 5/02208 |
| 2017/0137706 A1* | 5/2017 | Fujita ................. C09K 5/14 |

FOREIGN PATENT DOCUMENTS

| | | | |
|---|---|---|---|
| JP | 2009105125 A | * | 5/2009 |
| JP | 2009-272576 A | | 11/2009 |
| JP | 2011-014587 A | | 1/2011 |
| JP | 2011-049338 A | | 3/2011 |
| JP | 2016127142 A | * | 7/2016 |
| WO | WO-2014/083992 A1 | | 6/2014 |

* cited by examiner

LIGHT-EMITTING DEVICE

CROSS-REFERENCE TO RELATED APPLICATION

The present application is a continuation of U.S. patent application Ser. No. 15/608,661, filed on May 30, 2017, which claims priority to Japanese Patent Application No. 2016-109252, filed on May 31, 2016, the disclosure of which is hereby incorporated by reference in its entirety.

BACKGROUND

The present disclosure relates to a light-emitting device.

A semiconductor light-emitting device configured to extract light emitted from a semiconductor light-emitting element through a light-extracting window on which a light-transmissive film is attached has been described (see Japanese Unexamined Patent Application Publication No. H11-087778). The light-transmissive film is coated with a fluorescent substance. Alternatively, the fluorescent substances are dispersed in the light-transmissive film (see paragraph 0255 in Japanese Unexamined Patent Application Publication No. H11-087778).

SUMMARY

During operation of a semiconductor light-emitting device, a fluorescent substance is irradiated with light from the semiconductor light-emitting element, which allows the fluorescent substance to generate heat. Conventional semiconductor light-emitting devices may not have a structure considering such heat generation, and accordingly, such semiconductor light-emitting devices may not achieve higher output.

In one embodiment, a light-emitting device includes a semiconductor laser element, a supporting member located above the semiconductor laser element, the supporting member having a through-hole that allows light emitted from the semiconductor laser element to pass through, a fluorescent member located in the through-hole, the fluorescent member containing a fluorescent material excitable by light emitted from the semiconductor laser element so as to emit light having a wavelength different from a wavelength of light emitted from the semiconductor laser element, and a light-transmissive heat dissipating member including a base portion and a projecting portion projecting from the base portion into the through-hole, the through-hole is tapered so as to widen in an upward direction, an upper surface of the projecting portion of the heat-dissipating member bonded to a lower surface of the fluorescent member, and an upper surface of the base portion of the heat dissipating member bonded to a lower surface of the supporting member.

With the configuration above, both of the heat dissipation from a fluorescent member and the light extraction efficiency of a light-emitting device can be improved, so that high output of the light-emitting device can be effectively achieved.

DETAILED DESCRIPTION

Light-emitting Device 1 According to First Embodiment

Figure 1A:
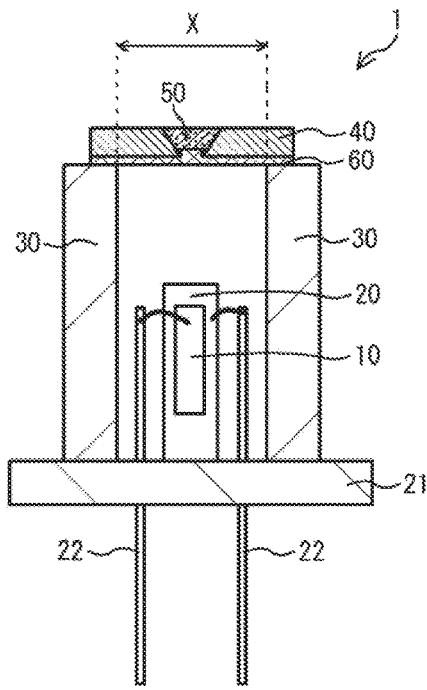
FIG. 1A is a schematic cross-sectional view of a light-emitting device according to a first embodiment.
Figure 1B:
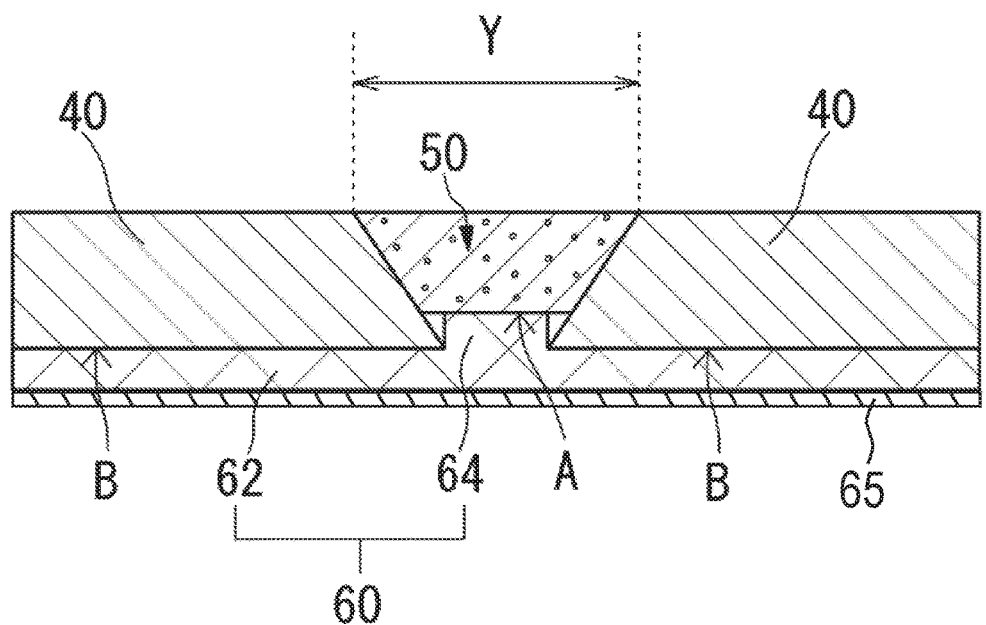
FIG. 1B is a schematic enlarged view of a supporting member, a fluorescent member, and a heat dissipating member in FIG. 1A.

FIG. 1A is a schematic cross-sectional view of a light-emitting device 1 according to a first embodiment. FIG. 1B is a schematic enlarged view of a supporting member 40, a fluorescent member 50, and a heat dissipating member 60 in FIG. 1A. As shown in FIG. 1A and FIG. 1B, the light-emitting device 1 includes a semiconductor laser element 10, the supporting member 40, the fluorescent member 50, and the light-transmissive heat dissipating member 60. The supporting member 40 is disposed above the semiconductor laser element 10 and defines a through-hole Y that allows light emitted from the semiconductor laser element 10 to pass through. The fluorescent member 50 is disposed in the through-hole Y and contains a fluorescent material that is excited by light from the semiconductor laser element 10 and emit light having a wavelength different from the wavelength of light from the semiconductor laser element 10 upon the excitation. The heat dissipating member 60 includes a base portion 62 and a projecting portion 64 projecting from the base portion 62 into the through-hole Y. The through-hole Y broadens upward. The upper surface of the projecting portion 64 of the heat dissipating member 60 is bonded to the lower surface of the fluorescent member 50. The upper surface of the base portion 62 of the heat dissipating member 60 is bonded to a lower surface of the supporting member 40.

With the present embodiment, both the heat dissipation from the fluorescent member 50 and the light extraction efficiency of the light-emitting device 1 can be improved, so that high output of the light-emitting device 1 can be effectively achieved. That is, improvement in the heat dissipation from the fluorescent member 50 allows for irradiation of the fluorescent member 50 with more intense light, so that output of the light-emitting device 1 can be enhanced. Further, improvement in the light extraction efficiency of the light-emitting device 1 can increase the amount of light extracted from the light-emitting device 1, so that output of the light-emitting device 1 can be enhanced. Accordingly, higher output of the light-emitting device 1 can be effectively achieved by improving both the heat dissipation from the fluorescent member 50 and the light extraction efficiency of the light-emitting device 1. Additional details will be described below.

Semiconductor Laser Element 10

For the semiconductor laser element 10, for example, a semiconductor laser element having a peak lasing wavelength in a range of 420 nm to 470 nm can be used. Improvement in the heat dissipation from the fluorescent member 50 as in the present embodiment allows the light-emitting device 1 to operate with stable optical properties even in the case where the fluorescent member 50 is irradiated with high-power laser light having output of, for example, 2.0 W or more, preferably in a range of 2.0 W to 5.0 W.

The semiconductor laser element 10 is disposed laterally to a heatsink 20. For the heatsink 20, a material with good thermal conductivity, such as copper, aluminum, and brass, is preferably used so that the heat dissipation from the fluorescent member 50 can be further improved. The heatsink 20 is fixed to a plate-shaped stem 21. The semiconductor laser element 10 is electrically connected to lead terminals 22 via electrically-conductive members such as wires.

Surrounding Member 30

A surrounding member 30 surrounds the semiconductor laser element 10 and defines an opening X through which light emitted from the semiconductor laser element 10 can pass. The lower surface of the heat dissipating member 60 is in contact with the upper surface of the surrounding member 30, and the lower surface of the supporting member 40 is bonded to the upper surface of the surrounding member 30 via the heat dissipating member 60. A heat-dissipating path that allows heat from the supporting member 40 to be transferred to the heat dissipating member 60 and further to the surrounding member 30 is provided, so that heat dissipation from the fluorescent member 50 is further improved. A material such as stainless steel and Kovar® (nickel-cobalt ferrous alloy) can be used for the surrounding member 30.

Supporting Member 40

The supporting member 40 is disposed above the semiconductor laser element 10. For the supporting member 40, for example, a ceramic with a high reflectance, or a metal member having a reflective film on the inner wall of the through-hole Y can be used. Using such a material as the supporting member 40 allows for facilitating reflection of light from the fluorescent member 50 on the inner wall of the through-hole Y, so that the light extraction efficiency of the light-emitting device 1 can be improved.

The supporting member 40 defines the through-hole Y through which light from the semiconductor laser element 10 can pass. The through-hole Y has a shape in which a width increases upward. With such a shape, for example, a portion of light that has been reflected in the fluorescent member 50 can be easily reflected upward by the inner wall of the through-hole Y, so that light extraction efficiency of the light-emitting device 1 can be further improved.

Fluorescent Member 50

The fluorescent member 50 is disposed in the through-hole Y. Thus, the inner wall of the through-hole Y is located at a lateral side of the fluorescent member 50. With the inner wall of the through-hole Y located at a lateral side of the fluorescent member 50, light from the fluorescent member 50 can be reflected on the inner wall of the through-hole Y, thereby improving the light extraction efficiency of the light-emitting device 1.

The fluorescent member 50 contains the fluorescent material to be excited by light emitted from the semiconductor laser element 10 and to emit light having a wavelength different from the wavelength of light emitted from the semiconductor laser element 10. More specifically, for example, a member containing the fluorescent material in a base member such as sintered body made of a ceramic material and a light-transmissive resin can be used for the fluorescent member 50. In particular, using a ceramic sintered body as the base member allows for reducing deformation of the fluorescent member 50 due to heat generated by the fluorescent material, so that optical properties of the light-emitting device 1 can be stabilized. Accordingly, the fluorescent member 50 can be irradiated with even more intense light, thereby more effectively achieving higher output of the light-emitting device 1. Examples of the ceramic material include aluminum oxide ($Al_2O_3$), zirconium oxide ($ZrO_2$), and titanium oxide ($TiO_2$).

Examples of the fluorescent material include yttrium-aluminum-garnet fluorescent materials (YAG fluorescent materials), lutetium-aluminum-garnet fluorescent materials (LAG fluorescent materials), terbium-aluminum-garnet fluorescent materials (TAG fluorescent materials), and SiAlON fluorescent materials. These materials can be used singly or in combination.

The fluorescent member 50 may contain a light-scattering member such as silicon oxide ($SiO_2$), aluminum oxide ($Al_2O_3$), zirconium oxide ($ZrO_2$), or titanium oxide ($TiO_2$). With the fluorescent member 50 containing the light-scattering member, light emitted from the semiconductor laser element 10 can be scattered within the fluorescent member 50, so that unevenness in color of light extracted from the light-emitting device 1 can be reduced. The light-scattering member has, for example, a granular shape.

Heat Dissipating Member 60

The heat dissipating member 60 includes the base portion 62 and the projecting portion 64 projecting from the base portion 62 into the through-hole Y and is light-transmissive to light from the semiconductor laser element 10. Sapphire or magnesia, having light-transmissive property, can be used for the heat dissipating member 60. Sapphire, which has relatively high heat dissipation performance, is preferably used. The heat dissipating member 60 can have a thickness in a range of about 200 μm to 1,000 μm. With the thickness of the heat dissipating member 60 of 200 μm or greater, the heat dissipation performance of the heat dissipating member 60 can be enhanced, so that the heat dissipation from the fluorescent member 50 can be further enhanced. With the thickness of the heat dissipating member 60 of 1,000 μm or smaller, lateral propagation of light through the heat dissipating member 60 can be reduced, so that light extraction efficiency of the light-emitting device 1 can be further enhanced.

The upper surface of the projecting portion 64 is bonded to the lower surface of the fluorescent member 50. The base portion 62 is bonded to the lower surface of the supporting member 40. Herein, the bonding surface between the upper surface of the projecting portion 64 and the lower surface of the fluorescent member 5 is referred to as a first bonding surface A, and the bonding surface between the base portion 62 and the lower surface of the supporting member 40 is referred to as a second bonding surface B. As described above, with a heat-dissipating path (heat-dissipating path across the first bonding surface A) through which heat from the fluorescent member 50 is directly transferred to the heat dissipating member 60 and a heat-dissipating path (heat-dissipating path across the second bonding surface B) through which heat from the fluorescent member 50 is indirectly transferred to the heat dissipating member 60 via the supporting member 40, the heat dissipation from the fluorescent member 50 can be improved. The lower surface of the fluorescent member 50 particularly easily generates heat by being irradiated with light emitted from the semiconductor laser element 10, and thus providing the heat-dissipating path across the first bonding surface A allows for effectively improving heat dissipation from the fluorescent member 50.

In the present embodiment, the heat dissipating member 60 includes the projecting portion 64, and the upper surface of the projecting portion 64 is bonded to the lower surface of the fluorescent member 50. With this arrangement, light traveling downward from the fluorescent member 50 is more easily reflected by the inner wall of the through-hole Y than in the case where the heat dissipating member 60 is flat, and a portion of light reflected on the inner wall of the through-hole Y is more likely to travel upward. In the present embodiment, light extraction efficiency of the light-emitting device 1 can be increased in this manner.

A dielectric multilayer film 65 that reflects light in a specific wavelength range may be disposed on the lower surface of the heat dissipating member 60 to improve the light extraction efficiency of the light-emitting device 1. For example, a film that serves to transmit light in a wavelength range of light emitted from the semiconductor laser element 10 and to reflect light in a wavelength range of light emitted from the fluorescent member 50 can be used for the dielectric multilayer film 65. With such a dielectric multilayer film 65 on the lower surface of the heat dissipating member 60, light traveling toward the lower surface of the heat dissipating member 60 can be reflected upward in the through-hole Y. Accordingly, the light extraction efficiency of the light-emitting device 1 can be further improved.

Light-emitting Device 2 According to Second Embodiment

Figure 2A:
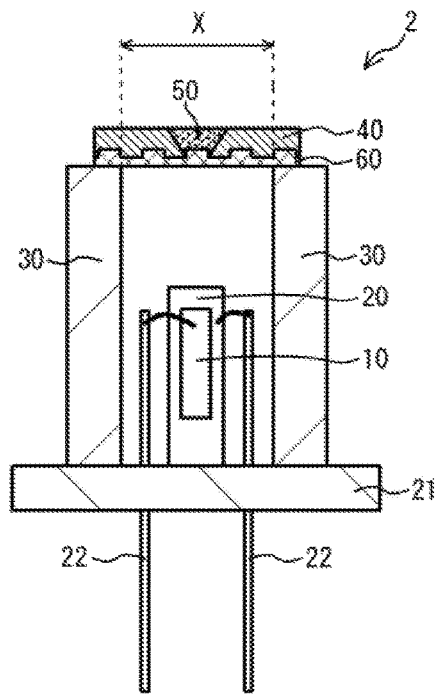
FIG. 2A is a schematic cross-sectional view of a light-emitting device according to a second embodiment.

FIG. 2A is a schematic cross-sectional view of a light-emitting device 2 according to a second embodiment.

Figure 2B:
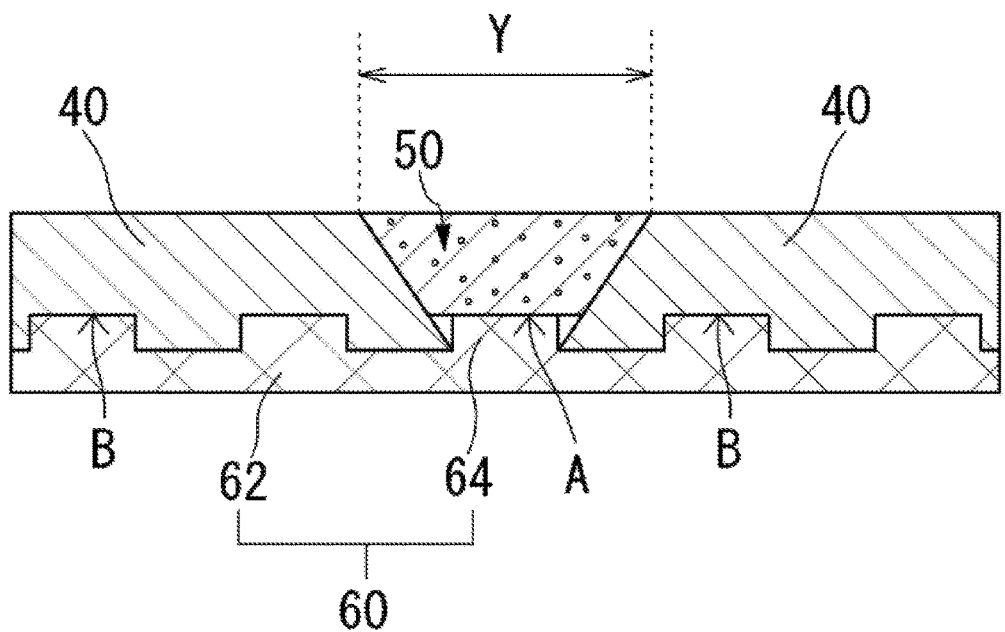
FIG. 2B is a schematic enlarged view of a supporting member, the fluorescent member, and a heat dissipating member in FIG. 2A.

FIG. 2B is a schematic enlarged view of a supporting member 40, the fluorescent member 50, and a heat dissipating member 60 in FIG. 2A. As shown in FIG. 2A and FIG. 2B, the light-emitting device 2 differs from the light-emitting device 1 according to the first embodiment in that the second bonding surface B of the light-emitting device 2 has an irregularity in a cross-sectional view while the second bonding surface B of the light-emitting device 1 according to the first embodiment has a substantially linear geometry in a cross-sectional view. In the second embodiment, the bonding area (i.e., area of the second bonding surface B) between the base portion 62 and the lower surface of the supporting member 40 can be increased compared with the case where the second bonding surface B has a linear geometry in a cross-sectional view. Accordingly, heat can be more effectively released through the heat-dissipating path (heat-dissipating path across the second bonding surface B) through which heat from the fluorescent member 50 is indirectly transferred to the heat dissipating member 60 via the supporting member 40, so that heat dissipation from the fluorescent member 50 can be further improved.

Light-emitting Device 3 According to Third Embodiment

Figure 3A:
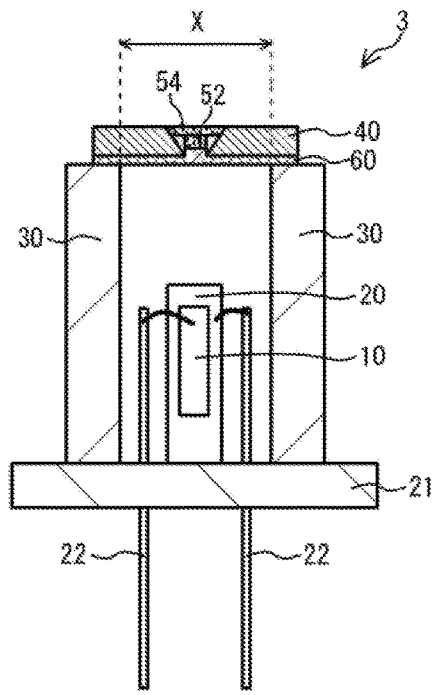
FIG. 3A is a schematic cross-sectional view of a light-emitting device according to a third embodiment.

FIG. 3A is a schematic cross-sectional view of a light-emitting device 3 according to a third embodiment.

Figure 3B:
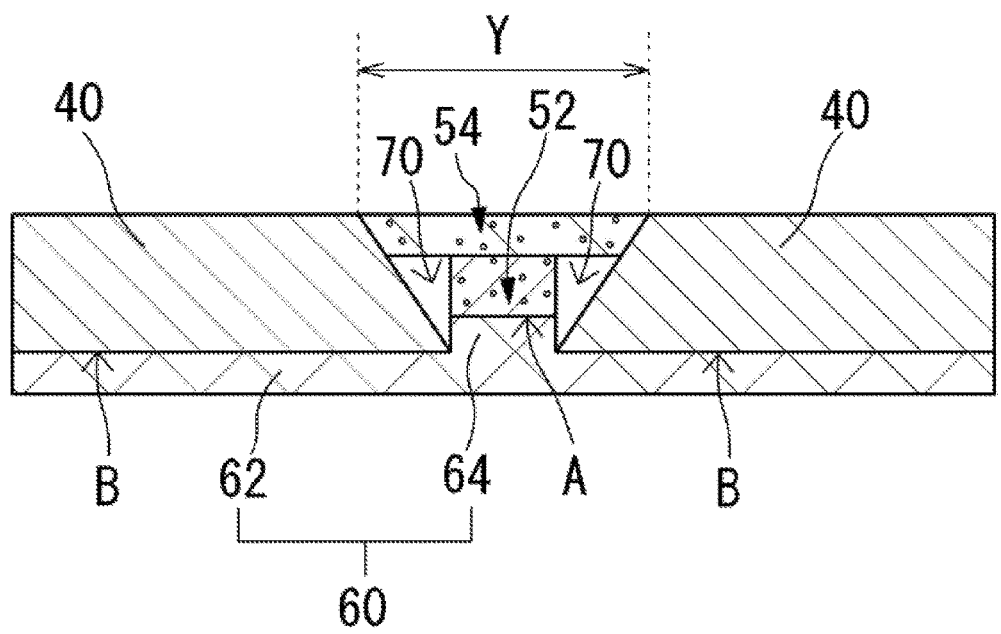
FIG. 3B is a schematic enlarged view of the supporting member, a fluorescent member, and the heat dissipating member in FIG. 3A.

FIG. 3B is a schematic enlarged view of the supporting member 40, a fluorescent member 50, and the heat dissipating member 60 in FIG. 3A. As shown in FIG. 3A and FIG. 3B, the light-emitting device 3 differs from the light-emitting device 1 according to the first embodiment in that the fluorescent member 50 includes a first fluorescent member 52 bonded to the upper surface of the projecting portion 64, and a second fluorescent member 54 having a lateral surface supported by the inner wall of the through-hole Y and having a lower surface that includes a portion bonded to the first fluorescent member 52. Also, the light-emitting device 3 differs from the light-emitting device 1 in that a low-refractive-index portion 70 having a refractive index smaller than the refractive index of the first fluorescent member 52 is present at a lateral side of the first fluorescent member 52, in the through-hole Y. The low-refractive-index portion 70 has a refractive index smaller than the refractive index of the first fluorescent member 52, preferably smaller than both of the refractive index of the supporting member 40 and the refractive index of the first fluorescent member 52. The refractive index of the first fluorescent member 52 herein is the refractive index of a member mainly exposed on the surface of the fluorescent member 52. The low-refractive-index portion 70 is preferably, for example, air.

With the low-refractive-index portion 70 having a refractive index smaller than the refractive index of the first fluorescent member 52 at a lateral side of the first fluorescent member 52, total reflection on the interface between the first fluorescent member 52 and the low-refractive-index portion 70 can be facilitated. Accordingly, light traveling from inside of the first fluorescent member 52 toward the inner wall of the through-hole Y can be reduced, so that light extraction efficiency of the light-emitting device 1 can be further improved. In the case where a ceramic material or the like is used for the supporting member 40, the low-refractive-index portion 70 preferably has a refractive index even smaller than the refractive index of the supporting member 40. With this arrangement, the inner wall of the through-hole Y allows light traveling from the low-refractive-index portion 70 to be reflected toward the supporting member 40. Accordingly, light entering the supporting member 40 can be reduced, so that leakage of light out of the light-emitting device 1 can be further reduced.

The present embodiment can preferably apply to the case where the supporting member 40 is made of a member having a relatively small reflectance, such as a ceramic material, and can also preferably apply to the case where the supporting member 40 is made of a member having a relatively large reflectance, such as a metal material. That is, a metal material has a reflectance greater than the reflectance of a ceramic, but a surface of the metal material easily absorbs light in the case where the fluorescent member 50 is in contact with the metal material unlike the case where the fluorescent member 50 is spaced from the metal material. However, even in this case, with the low-refractive-index portion 70 having a refractive index smaller than the refractive index of the supporting member 40, decrease in the light extraction efficiency of the light-emitting device 1 can be prevented.

In the present embodiment, the low-refractive-index portion 70 is present at a lateral side of the first fluorescent member 52, the lateral surface of the second fluorescent member 54 is bonded to the inner wall of the through-hole Y, and a portion of the lower surface of the second fluorescent member 54 is bonded to the upper surface of the first fluorescent member. With this arrangement, the first fluorescent member 52 can be fixed between the lower surface of the second fluorescent member 54 and the upper surface of the heat dissipating member 60. Accordingly, even in the case where the first fluorescent member 52 has a high melting point and thus is difficult to be fusion-bonded to the inner wall of the through-hole Y, fixing the second fluorescent member 54 to the inner wall of the through-hole Y by fusion-bonding allows the first fluorescent member 52 to be disposed in the through-hole Y.

A ceramic containing a fluorescent-material is preferably used for the first fluorescent member 52, and a glass containing a fluorescent material is preferably used for the second fluorescent member 54. With this constitution, the first fluorescent member 52 and the second fluorescent member 54 can be fixed by disposing the second fluorescent member 54 above the first fluorescent member 52 and fusion-bonding the second fluorescent member 54 to the upper surface of the first fluorescent member 52 and the inner wall of the through-hole Y. Further, using a ceramic containing a fluorescent-material, which has good heat resistance, for the first fluorescent member 52, which is initially irradiated with light from the semiconductor laser element 10, allows the second fluorescent member 54 to contain a fluorescent material having, for example, poor heat resistance. In the fusion bonding, the first fluorescent member 52 and the second fluorescent member 54 are heated at a temperature at which the second fluorescent member 54 containing a glass is melted to the degree that enables fusion bonding and the first fluorescent member 52 containing a ceramic is not melted to the degree that enables fusion bonding. The heating is performed at, for example, about 850° C. Performing heating at this temperature allows the first fluorescent member 52 and the second fluorescent member 54 to be fixed in the through-hole Y while reducing damage to the fluorescent materials due to heat.

The first fluorescent member 52 may contain a fluorescent material that emits light having a wavelength different from that of light emitted from a fluorescent material of the second fluorescent member 54. With this arrangement, color of light extracted from the light-emitting device 3 can be adjusted. For example, by using a semiconductor laser element for emitting blue light for the semiconductor laser element 10, a fluorescent member containing a fluorescent material that emits yellow light for the first fluorescent member 52, and a fluorescent member containing a fluorescent material that emits red light for the second fluorescent member 54, white light can be extracted from the light-emitting device 3.

The first to third embodiments have been described above, but the present invention is not limited to the described embodiments.

What is claimed is:
1. A light-emitting device comprising:
a semiconductor laser element;
a surrounding member surrounding the semiconductor laser element;
a supporting member located above the surrounding member, wherein the supporting member comprises a through-hole that allows light emitted from the semiconductor laser element to pass therethrough;
a first fluorescent member located above the semiconductor laser element, wherein the first fluorescent member contains a fluorescent material that is excitable by light emitted from the semiconductor laser element so as to emit light having a wavelength different from a wavelength of the light emitted from the semiconductor laser element, and wherein the first fluorescent member is located in the through-hole;
a light-transmissive heat dissipating member, wherein an upper surface of the heat dissipating member is bonded to a lower surface of the first fluorescent member, and wherein a thickness of the heat dissipating member is equal to or greater than 200 µm and equal to or smaller than 1000 µm; and
a reflective film located below the lower surface of the first fluorescent member and below the upper surface of the heat dissipating member, wherein the reflective film is adapted to transmit the light emitted from the semiconductor laser element and to reflect the light emitted from the first fluorescent member having the wavelength different from the wavelength of the light emitted from the semiconductor laser element.

2. The light-emitting device according to claim 1, wherein the reflective film is a dielectric multilayer film.

3. The light-emitting device according to claim 1, wherein the reflective film is located at least 200 µm lower than the lower surface of the first fluorescent member.

4. The light-emitting device according to claim 1, wherein the reflective film is not disposed on the lower surface of the first fluorescent member.

5. The light-emitting device according to claim 1, wherein the supporting member comprises a ceramic material.

6. The light-emitting device according to claim 1, wherein the heat dissipating member comprises sapphire.

7. The light-emitting device according to claim 1, further comprising a second fluorescent member, wherein a lower surface of the second fluorescent member is bonded to the upper surface of the first fluorescent member.

8. The light-emitting device according to claim 7, wherein:
the first fluorescent member comprises a ceramic containing the fluorescent material,
the second fluorescent member comprises a glass containing a fluorescent material, and
the second fluorescent member is fusion bonded to an upper surface of the ceramic of the first fluorescent member.

9. The light-emitting device according to claim 7, wherein:
the supporting member comprises an upper surface and a lower surface, each of which intersects with an inner wall of the through-hole,
an upper opening of the through-hole located at the upper surface side of the supporting member is closed by the second fluorescent member,
a lower opening of the through-hole located at the lower surface side of the supporting member is closed by the heat dissipating member.

10. The light-emitting device according to claim 1, further comprising:
a second fluorescent member, wherein a lower surface of the second fluorescent member is bonded to the upper surface of the first fluorescent member,
wherein the supporting member comprises a ceramic material,
wherein the heat dissipating member comprises sapphire,
wherein the first fluorescent member comprises a ceramic containing the fluorescent material,
wherein the second fluorescent member comprises a glass containing a fluorescent material, and
wherein the second fluorescent member is fusion bonded to an upper surface of the ceramic of the first fluorescent member and to an inner wall of the ceramic of the supporting member.

11. The light-emitting device according to claim 1, wherein:
a lower surface of the supporting member is bonded to the upper surface of the heat dissipating member, and
a lower surface of the heat dissipating member is bonded to an upper surface of the surrounding member.

12. The light-emitting device according to claim 1, wherein the heat dissipating member comprises a projecting portion projecting into the through-hole to a location above a lower surface of the supporting member.

13. The light-emitting device according to claim 1, wherein:
the supporting member comprises an upper surface and a lower surface, each of which intersects with an inner wall of the through-hole,
an upper opening of the through-hole located at the upper surface side of the supporting member is closed by the first fluorescent member, and a lower opening of the through-hole located at the lower surface side of the supporting member is closed by the heat dissipating member.

* * * * *